(12) United States Patent
Shirafuji et al.

(10) Patent No.: US 7,648,922 B2
(45) Date of Patent: Jan. 19, 2010

(54) FLUOROCARBON FILM AND METHOD FOR FORMING SAME

(75) Inventors: Tatsuru Shirafuji, Kyoto (JP); Kunihide Tachibana, Kyoto (JP)

(73) Assignees: Kyoto University, Kyoto (JP); Zeon Corporation, Tokyo (JP)

( * ) Notice: Subject to any disclaimer, the term of this patent is extended or adjusted under 35 U.S.C. 154(b) by 575 days.

(21) Appl. No.: 10/536,774

(22) PCT Filed: Nov. 9, 2004

(86) PCT No.: PCT/JP2004/016606

§ 371 (c)(1), (2), (4) Date: May 26, 2005

(87) PCT Pub. No.: WO2006/008841

PCT Pub. Date: Jan. 26, 2006

(65) Prior Publication Data

US 2007/0020951 A1   Jan. 25, 2007

(30) Foreign Application Priority Data

Jul. 22, 2004   (JP) .............................. 2004-214543

(51) Int. Cl.
*H01L 21/31* (2006.01)
*H01L 21/469* (2006.01)

(52) U.S. Cl. ....................... 438/763; 438/624; 438/758; 438/778; 438/779; 438/780; 257/E21.27; 257/E21.259; 257/E21.264

(58) Field of Classification Search ......... 438/400–404, 438/584–597, 622–624, 637, 672–675, 700, 438/733, 734, 758–763, 778–780, 463, 638; 257/E21.27, E21.259, E21.264
See application file for complete search history.

(56) References Cited

U.S. PATENT DOCUMENTS 6,215,087 B1 * 4/2001 Akahori et al. ........ 219/121.43
(Continued)

FOREIGN PATENT DOCUMENTS

JP    10-92804    4/1998
(Continued)

OTHER PUBLICATIONS

Shirafuji et al., "PlasmaCopolymerization of C6F6/C5F8 for Application of Low-Dielectric-Constant Fluorinated Amorphous Carbon Films and Its Gas-Phase Diagnostics Using In Situ Fourier Transform Infrared Spectroscopy", May 11, 2004, Japanese Journal of Applied Physics, vol. 43, No. 5A, pp. 2697-2703.*

(Continued)

*Primary Examiner*—Charles D Garber
*Assistant Examiner*—Abdulfattah Mustapha
(74) *Attorney, Agent, or Firm*—Charles A. Muserlian

(57) ABSTRACT

The major objective is to provide a fluorocarbon film wherein fine voids are formed by a step (SA1) for introducing a mixed gas containing a first carbon fluoride gas and a second carbon fluoride gas on a substrate placed inside a chamber, and depositing a fluorocarbon film on the substrate; and a step (SA2) for forming voids in the fluorocarbon film by selectively removing volatile components contained in the fluorocarbon film are included and especially in the step (SA2) for forming voids, it is preferable to include a step for cleaning the fluorocarbon film with a supercritical fluid.

20 Claims, 9 Drawing Sheets

U.S. PATENT DOCUMENTS

| | | | |
|---|---|---|---|
| 6,429,518 B1 * | 8/2002 | Endo | 257/753 |
| 6,440,878 B1 * | 8/2002 | Yang et al. | 438/783 |
| 6,524,963 B1 | 2/2003 | Zhou | |
| 6,531,409 B1 * | 3/2003 | Iwabuchi | 438/766 |
| 6,593,246 B1 * | 7/2003 | Hasegawa et al. | 438/736 |
| 2002/0122096 A1 * | 9/2002 | Eida et al. | 347/45 |
| 2004/0006249 A1 * | 1/2004 | Hoshino et al. | 570/123 |
| 2004/0161946 A1 * | 8/2004 | Tsai et al. | 438/778 |
| 2004/0175501 A1 * | 9/2004 | Lukas et al. | 427/255.28 |
| 2005/0176230 A1 * | 8/2005 | Sieber et al. | 438/609 |
| 2006/0040507 A1 * | 2/2006 | Mak et al. | 438/758 |
| 2006/0264059 A1 * | 11/2006 | Kobayashi et al. | 438/758 |

FOREIGN PATENT DOCUMENTS

| | | |
|---|---|---|
| JP | 374 256-261 | 2/2000 |

OTHER PUBLICATIONS

Kazuo Takahashi, et al, Structure and Pore Formation of Fluorocarbon Films Polymerized in Plasmas, V-4 2001 Dry Process International Symposium pp. 181 to 186.

Tatsuru Shirafuju, et al Plas Copolymerization of . . . Infrared Spectroscopy, Japanese journal of Applied Physics, vol. 43, No. 5A, 2004, pp. 2697-1703.

* cited by examiner

SA1 — Depositing of fluorocarbon film

SA2 — Forming voids (a)

(b)

(a)

(b)

(a)

(b)

(c)

FLUOROCARBON FILM AND METHOD FOR FORMING SAME

TECHNICAL FIELD

The present invention relates to an amorphous fluorocarbon film used in the technical field of a semiconductor device manufacturing process, for example and a method for forming the same, and the like.

BACKGROUND ART

Conventionally, although silicon oxide ($SiO_2$) films have been widely used as interlayer insulation films for semiconductor devices, signal delay caused by the electrostatic capacity between wirings or electrostatic capacity between layers and wiring resistance has increased with miniaturization. Therefore, there is a need for a technique for forming an insulation film having a specific inductive capacity lower than that of a silicon oxide film (hereafter referred to as "low-dielectric-constant film").

An amorphous fluorinated carbon obtained by depositing carbon fluoride gas (hereafter simply referred to as "fluorocarbon film" in this specification) has attracted attention because of extremely low specific inductive capacity among various low-dielectric-constant films (refer to documents described below).

[Non-Patent Document 1] Tatsuru SHIRAFUJI et. al., Jpn. J. Appl. Phys., Vol. 42 (2003), pp. 4504-4509

[Patent Document 1] Japanese Patent Application Laid-Open No. 2000-332001

[Patent Document 2] Japanese Patent Application Laid-Open No. 9-237783 [Patent Document 3] WO99/28963

DISCLOSURE OF THE INVENTION

Problems to Be Solved by the Invention

However, it is very much a situation that even a fluorocarbon film said to have the lowest dielectric constant has the value of 2 or more, and falls well short of the theoretical limit value ($\kappa=1.0$).

It is an object of the present invention to provide a fluorocarbon film having a sufficiently low dielectric constant that can reduce signal delay associated with the high integration of semiconductor devices, an electronic device using the same, and a method for forming such a fluorocarbon film; and the major technical subject thereof is to provide a fluorocarbon film wherein fine voids are formed.

Means for Solving the Problems

As a result of the present inventors' repetitive studies for solving the above-described problems, they have reached the idea to provide a large number of fine voids in a fluorocarbon film, and thereby lower the dielectric constant of the fluorocarbon film.

The method for forming a fluorocarbon film having voids according to the present invention is characterized by including a step (SA1) for introducing a mixed gas containing a first carbon fluoride gas and a second carbon fluoride gas on a substrate placed inside a chamber, and depositing a fluorocarbon film on the substrate; and a step (SA2) for forming voids in said fluorocarbon film by selectively removing volatile components contained in the fluorocarbon film.

In this specification, a "carbon fluoride gas" means various fluorocarbons or hydrofluorocarbons [gases represented by chemical formulas $C_xF_y$ (x and y are integers), $C_xF_yH_z$ (x, y and z are integers) and the like], and a fluorocarbon film means a film of a copolymer of these gases.

The above-described method for forming a fluorocarbon film is preferable in the aspect that a large number of fine voids can be obtained by using a fluorine-containing compound having 4 to 5 carbon atoms as a first carbon fluoride gas, and a fluorine-containing compound having 6 to 12 carbon atoms as a second carbon fluoride gas.

It is preferable that the step for forming voids includes a step for cleaning the above-described fluorocarbon film with a supercritical fluid. Any supercritical fluids can be used, and for example, carbon dioxide, water, alcohol or the like can be used.

The step for forming voids can include a step for heating the above-described fluorocarbon film. The conditions for heat treatment can be, for example, a slow heat treatment, or a rapid heat treatment (RTA).

It is preferable that the above-described chamber is a plasma enhancing chamber that can internally generate plasma. Various plasma generating systems can be used, and for example, an inductive coupling type, a capacitive coupling type or the like can be considered.

It is preferable that the above-described first carbon fluoride gas has relatively high volatility, and the above-described second carbon fluoride gas has relatively low volatility. By varying the mixing ratios of these carbon fluoride gases, the content of voids can be varied.

The mixing ratio of the first and second carbon fluoride gases in terms of the proportion of the first carbon fluoride gas to the total quantity of the both is preferably 10 to 90 mol %, more preferably 30 to 90 mol %, and further preferably 50 to 80 mol %. When the mixing ratio is within these ranges, a fluorocarbon film having particularly low specific inductive capacity can be obtained.

The above-described mixed gas may contain other gases other than the first and second carbon fluoride gases, such as argon gas, helium gas, neon gas and xenon gas, or may contain no other gases.

However, the quantity of the above-described other gases that can be contained in the mixed gas in terms of the proportion of the other gases to the total quantity of all the gases is preferably 50 mol % or less, more preferably 20 mol % or less, and further preferably 5 mol % or less.

Although low-dielectric-constant films include a type referred to as "organic-inorganic hybrid film" that contains silicon atoms, such as a siloxane-based monomer, in a part of the fluorocarbon film, the fluorocarbon film according to the present invention is characterized in that no silicon atoms are contained, and a deposited film formed using two or more carbon fluoride gases having different vapor pressure (ease of vaporizing) as starting materials is used.

ADVANTAGES OF THE INVENTION

By providing a fluorocarbon film with a large number of fine voids to make it porous, the specific inductive capacity can be more lowered. Using this method, a fluorocarbon film having a specific inductive capacity of 2 or below can be obtained. This fluorocarbon film can also be applied to the surface-coating materials of printed substrates for high-frequency circuits, gas adsorbing materials and the like, as well as the interlayer insulation films of semiconductor devices.

Description of Symbols

| | |
|---|---|
| 10 | Component having high volatility |
| 11 | Component having low volatility |
| 30 | Plasma enhanced chemical vapor deposition apparatus |
| 33 | First gas cylinder |
| 34 | Second gas cylinder |
| 35 | Temperature elevating means |
| 36, 38 | Mass flow controller |
| 40, 50 | Chamber |
| 41 | Coil |
| 42, 52 | Matching circuit |
| 46, 56 | Gas supply port |
| 61 | Cylinder of supercritical fluid |
| 62 | High-pressure pump |
| 63 | Heater |
| 64 | High-pressure cell |
| 65 | space |
| 67 | Temperature controlling device |
| 81 | Void |
| 82, 92, 94 | Fluorocarbon film |
| 83 | Printed substrate for high frequency |
| 91 | Substrate (base material) |
| 93 | String |
| 95a, 95b | Reel |
| S | Substrate |
| A | Void |

BEST MODE FOR CARRYING OUT THE INVENTION

Basic Concept of the Present Invention

Figure 1:
FIG. 1 is a diagram showing basic steps of the present invention.

The method for manufacturing a fluorocarbon film having voids according to the present invention including two major steps. FIG. 1 is a diagram showing the basic steps of the present invention.

(1) Film Formation Step [SA1]

Figure 2:
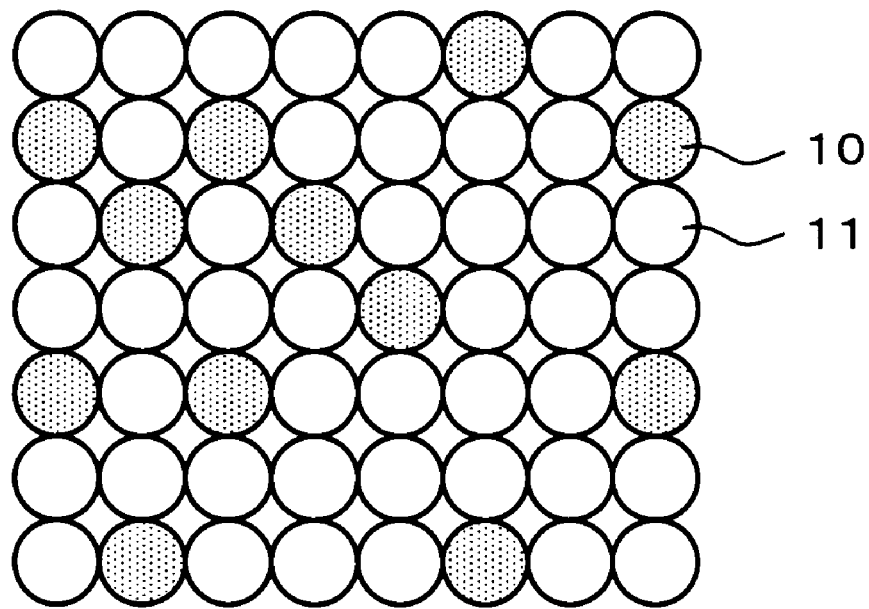
FIG. 2 (a) is a diagram schematically showing the film structure immediately after film forming (before void forming); and (b) is a diagram showing the aspect wherein volatile components 10 have been removed, and a large number of voids A have been internally formed.
Figure 2:
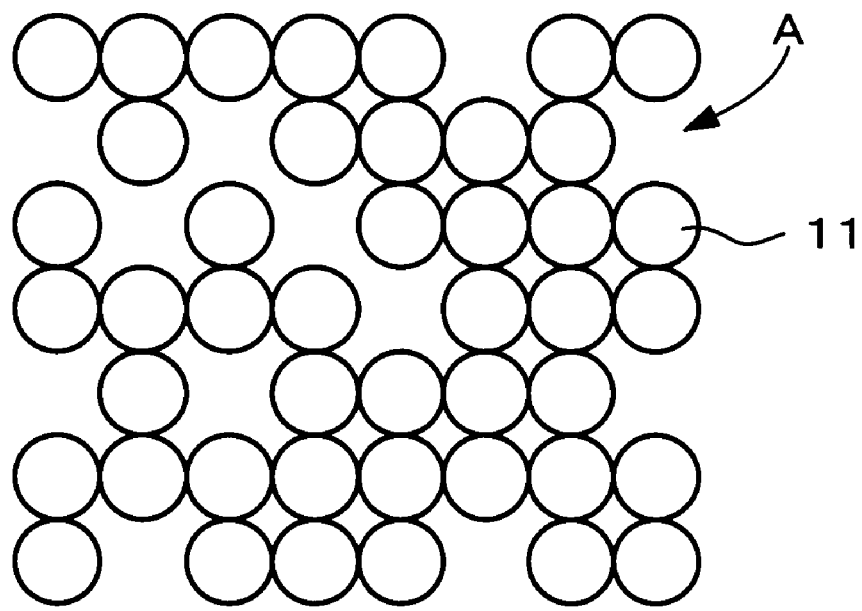

This is a step for forming a fluorocarbon film composed of a component having relatively high volatility, and a component having relatively low volatility. FIG. 2 (a) is a diagram schematically showing the film structure immediately after film forming (before void forming), and shows the aspect composed of a component having high volatility 10, and a component having low volatility 11.

Generally when a fluorocarbon film is deposited, one type of carbon fluoride gas is often contained in the material gas, and a gas having low volatility is used. This is for raising the density of the fluorocarbon film obtained after film formation.

However, in the present invention, a fluorocarbon film is deposited using as the starting material a carbon fluoride gas that contains a mixed gas of a first carbon fluoride gas having relatively high volatility and a second carbon fluoride gas having relatively low volatility as the major component. Thereby, even if large quantities of volatile components remain in the fluorocarbon film immediately after deposition, these volatile components can be removed by the subsequent treatment. As a result, the present inventors found that a large number of fine voids could be formed in the fluorocarbon film.

The plasma CVD apparatus is in itself a very precision technique wherein the growth of the obtained film is affected by a very small difference in experiment conditions, and the gas piping for supplying the material elements and the structure of the reaction apparatus portion of the apparatus is complicated, and there are innumerable combinations of reaction conditions due to the setting of gas supply conditions, reaction temperatures and the like.

Therefore, from various viewpoints, such as the film-forming rate, the content of volatile components, and the coverage of bumps, the conditions of high-quality film formation can be more efficiently obtained by optimizing each of these film-forming conditions.

(Preferable Example of First Carbon Fluoride Gas)

A preferable example of the "first carbon fluoride gas" in the present invention is a fluorine-containing compound of the carbon number of 4 to 5, which is a compound having 4 to 5 carbon atoms in a molecule, and having one or more fluorine atom directly bonded to the carbon atom.

For example, it is a perfluorocarbon of the carbon number of 4 to 5, or a hydrofluorocarbon of the carbon number of 4 to 5. Perfluorocarbons include saturated perfluorocarbons and unsaturated perfluorocarbons. When comprehensively evaluated from the viewpoint of the insulating performance of the obtained film, perfluorocarbons of the carbon number of 4 to 5 is more preferable than hydrofluorocarbon of the carbon number of 4 to 5, unsaturated perfluorocarbons of the carbon number of 5 is further preferable, and the cyclic unsaturated perfluorocarbons of the carbon number of 5 is most preferable.

SPECIFIC EXAMPLES (a) Cyclic unsaturated perfluorocarbons, such as hexafluorocyclobutene, hexafluoro-(1-methylcyclopropene), octafluorocyclopentene, octafluoro-(1-methylcyclobutene), and octafluoro-(1,2-dimethylcyclopropene);

(b) straight-chain or branched unsaturated perfluorocarbons having a triple bond in a molecule, such as hexafluoro-2-butine, hexafluoro-1-butine, octafluoro-1-pentine, and octafluoro-2-pentine; and hexafluorovinylacetylene;

(c) unsaturated perfluorocarbons having a plurality of double bonds in a molecule, such as hexafluoro-1,3-butadiene, octafluoro-1,3-pentadiene, octafluoro-1,4-pentadiene, and octafluoroisoprene;

(d) straight-chain or branched unsaturated perfluorocarbons having one double bond in a molecule, such as octafluoro-1-butene and octafluoro-2-butene;

(e) hydrofluorocarbons of the carbon number of 4 to 5, such as 2H-heptafluoro-2-butene, 2H-pentafluoro-1,3-butadiene, 1H-pentafluorocyclobutene, 3H-pentafluorocyclobutene, 2H-nonafluoro-2-pentene, 3H-nonafluoro-2-pentene, 1H-heptafluorocyclopentene, 3H-heptafluorocyclopentene, 1H,2H-tetrafluorocyclobutene, 1H,3H-tetrafluorocyclobutene, 1H,2H-hexafluorocyclopentene, 1H,3H-hexafluorocyclopentene, and 1H,5H-hexafluorocyclopentene, can be listed; from the point of view of the insulating performance of the obtained film:

(A) hexafluoro-2-butine, hexafluoro-1-butine, hexafluorocyclobutene, hexafluoro-1,3-butadiene, hexafluoro-(1-methylcyclopropene), octafluoro-1-butene, octafluoro-2-butene, octafluoro-1-pentine, octafluoro-2-pentine, octafluoro-1,3-pentadiene, octafluoro-1,4-pentadiene, octafluorocyclopentene, octafluoroisoprene, hexafluorovinylacetylene, octafluoro-1-methylcyclobutene, or octafluoro-1,2-dimethylcyclopropene is preferable;

(B) octafluoro-2-pentine, octafluoro-1,3-pentadiene, or octafluorocyclopentene is more preferable;

(C) octafluoro-2-pentine or octafluorocyclopentene is further preferable; and (D) octafluorocyclopentene is especially preferable.

(Preferable Specific Examples of Second Carbon Fluoride Gas)

A preferable example of the "second carbon fluoride gas" in the present invention is a fluorine-containing compound of the carbon number of 6 to 12, which is a compound having 6 to 12 carbon atoms in a molecule, and having one or more fluorine atom directly bonded to the carbon atom.

For example, it is a perfluorocarbon of the carbon number of 6 to 12, or a hydrofluorocarbon of the carbon number of 6 to 12. When comprehensively evaluated from the viewpoint of the insulating performance and strength of the obtained film, perfluorocarbons of the carbon number of 6 to 12 is more preferable than hydrofluorocarbon of the carbon number of 6 to 12, unsaturated perfluorocarbons of the carbon number of 6 to 8 is more preferable, the cyclic unsaturated perfluorocarbons of the carbon number of 6 to 8 is further preferable, and cyclic unsaturated perfluorocarbons of the carbon number of 6 is most preferable.

Preferably used cyclic unsaturated perfluorocarbon is aromatic perfluorocarbon.

SPECIFIC EXAMPLES (f) Aromatic perfluorocarbons, such as hexafluorobenzene, octafluorotoluene, decafluoro-o-xylene, decafluoro-m-xylene, decafluoro-p-xylene, pctafluorostyrene, nonafluoro-1,3,5-trimethylbenzene, and octafluoronaphthalene;

(g) straight chain or branched unsaturated perfluorocarbons having one double bond in a molecule, such as dodecafluoro-1-hexene, dodecafluoro-2-hexene, dodecafluoro-3-hexene, undecafluoro-1-heptene, undecafluoro-2-heptene, and undecafluoro-3-heptene;

(h) cyclic unsaturated perfluorocarbons having one double bond in a molecule, such as decafluorocyclohexene and dodecafluorocycloheptene;

(i) unsaturated perfluorocarbons having a plurality of double bonds in a molecule, such as decafluoro-1,3-hexadiene, decafluoro-1,4-hexadiene, decafluoro-1,5-hexadiene, decafluoro-2,4-hexadiene, octafluorocyclo-1,3-hexadiene, and octafluorocyclo-1,4-hexadiene;

(j) straight chain or branched unsaturated perfluorocarbons having a triple bond in a molecule, such as decafluoro-2-hexine and decafluoro-3-hexine; and (k) hydrofluorocarbons of the carbon number of 6 to 10, such as pentafluorobenzene, tetrafluorobenzene, trifluorobenzene, benzotrifluoride, pentafluorotoluene, 2,3,4,5,6-pentafluorostyrene, 1,3-bis(trifluoromethyl) benzene, 1,4-bis(trifluoromethyl) benzene, and tetrafluoronaphthalene can be listed; from the relationship between insulating performance and strength of the obtained film, (E) hexafluorobenzene, decafluoro-o-xylene, decafluoro-m-xylene, or decafluoro-p-xylene is preferable; and (F) hexafluorobenzene is especially preferable.

(2) Void Formation (Pore Forming) Step [SA2]

After the above-described film-forming step, by removing the component having high volatility, a large number of fine voids are formed. FIG. 2(b) shows the aspect wherein volatile components 10 have been removed and a large number of voids A have been internally formed. Conventionally, although there has been a so-called "porous silicon film", wherein fine voids are formed in an inorganic insulating film or an organic-inorganic hybrid film containing silicon atoms, since it has been considered that a denser fluorocarbon film is preferable for the reason that fluorocarbon films have intrinsically a low mechanical strength, the idea of making the film porous by providing voids is considered to be a come-from-behind idea that defies the common sense of those skilled in the art.

As the method for removing volatile components, a method of heating a fluorocarbon film, and a method of forming voids without heating, can be considered.

When the volatile components are removed by heating, the fluorocarbon film deposited in the above-described step [SA1] is heated in an inert gas, such as nitrogen and helium, at 50° C. to 45° C., further preferably 100° C. to 45° C., and especially preferably 300° C. to 450° C. If the temperature when heating is excessively low, the formation of voids becomes insufficient, and the specific inductive capacity becomes difficult to lower.

However, when heated, there may be the case wherein the problem that the densification of the film occurs and the thickness of the film decreases. If the temperature when heating is excessively high, there may be the case wherein the film decreasing rate (decreasing rate of film thickness) becomes excessively large and becomes impractical. However, if the heating conditions are optimized, decrease in the film thickness can be minimized, and the volatile components can be sufficiently removed.

On the other hand, when voids are formed without heating, a method called "cleaning with a supercritical fluid" can be used. Since a supercritical fluid has high permeability to a substance, it can enter into molecular-level fine gaps of the deposited amorphous carbon film. Therefore, if a supercritical fluid is used, only volatile components can be selectively removed.

The fluorocarbon film according to the present invention has a void ratio of preferably 20 to 80%, further preferably 30 to 70%, and especially preferably 40 to 60%. When the void ratio is within the above-described range, the dielectric constant lowers.

The fluorocarbon film according to the present invention has a specific inductive capacity of 2 or less, preferably 1.8 or less, and especially preferably 1.6 or less, which is extremely lower than the specific inductive capacity of conventional low-dielectric-constant films.

—Construction of a Depositing Apparatus—

First, a fluorocarbon-film forming step, which is a first step of the method for manufacturing the fluorocarbon film according to the present invention, will be described. This step is common to all of the various embodiments.

Figure 3:
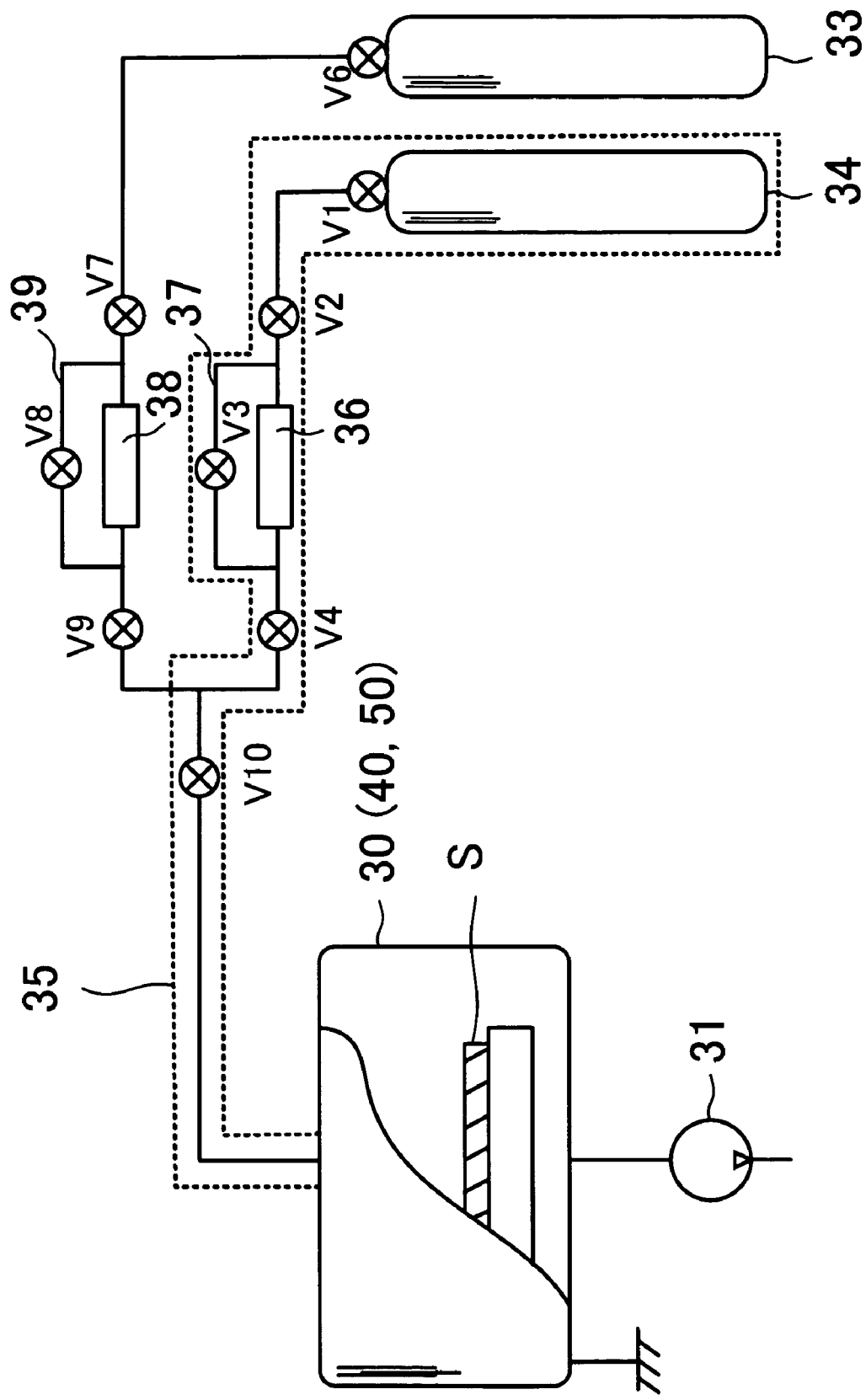
FIG. 3 is a system diagram showing an example of an apparatus for depositing a fluorocarbon film.

FIG. 3 shows a system diagram showing an example of an apparatus for depositing a fluorocarbon film. In the plasma enhanced chemical vapor deposition apparatus (PE-CVD: Plasma Enhanced Chemical Vapor Deposition) 30 while the chamber of the apparatus 30 is evacuated using a vacuum pump 31, and a material gas is introduced into the chamber.

As the material gas, at least two kinds of carbon fluoride gases are required, and these are encapsulated in a first gas cylinder 33 and a second gas cylinder 34. The pipes are divided with valves V1 to V10, and the flow rate of each material gas is controlled by mass flow controllers (MFCs) 36 and 38 installed in each supply line. The lines for each material gas are finally joined into one line, and connected to the chamber. The valves V3 and V8 shown in this drawing are the valves for controlling the connection to bypass lines 37 and 39.

Broken lines in the drawing show a temperature elevating means 35. A gas having low vapor pressure becomes liquid at normal temperature and normal pressure.

When such a liquid source (material) is used, the material is vaporized by heating the gas cylinder, the sidewall of the chamber, and pipes connecting those, with the temperature elevating means 35.

As the mass flow controller (MFC) 36 installed in the line for the low vapor pressure system to which the temperature elevating means is applied, that of heat-resistant specifications is used. In the case of a gas having high vapor pressure, the addition of the temperature elevating means is not especially required because such a gas is gaseous at normal temperature and normal pressure.

Various kinds of apparatuses for depositing a fluorocarbon film have been known. As long as the fluorocarbon film can be deposited using a mixed gas of carbon fluoride gases as the starting material, any film-forming apparatuses can be used. The connection of material-gas supply lines can also be optionally changed.

Figure 4:
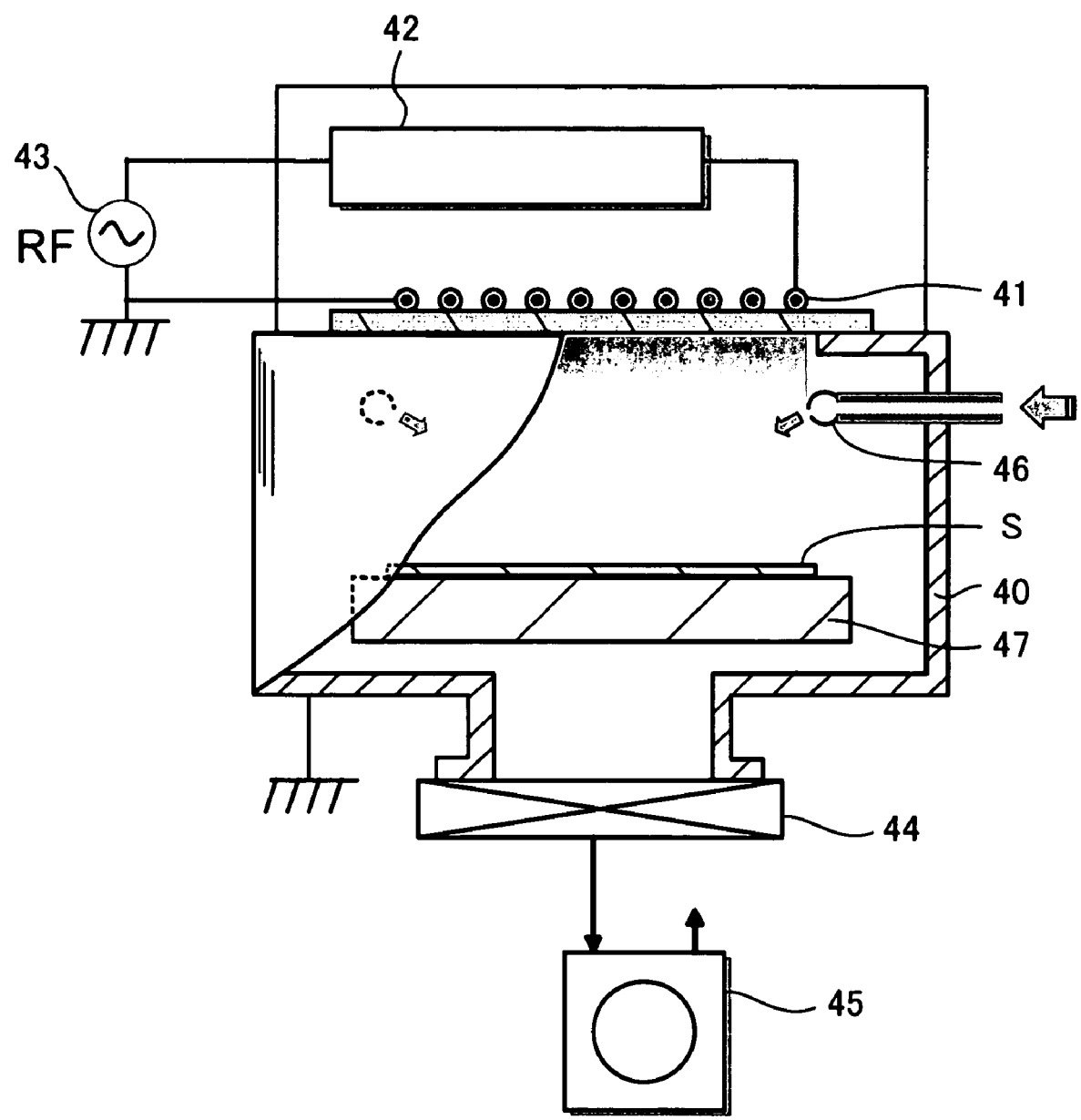
FIG. 4 is a partly sectional view showing an example of an inductively-coupled plasma CVD apparatus.

For example, FIG. 4 is a partly sectional view showing an example of a plasma CVD apparatus adopting a system for generating plasma called inductively-coupled plasma (ICP).

A coil 41 is installed on the upper portion of a cylindrical chamber 40, connected through a matching circuit 42 to a high-frequency power source 43 to generate plasma. The inside of the chamber is consistently evacuated using a vacuum pump 45 connected through the valve 44, and maintained at a predetermined pressure.

A gas supply port 46 is also installed inside the chamber, from which the material gas is introduced.

A substrate for depositing a fluorocarbon film is placed on the substrate holding table (susceptor) 47 having an incorporated heater (not shown).

Figure 5:
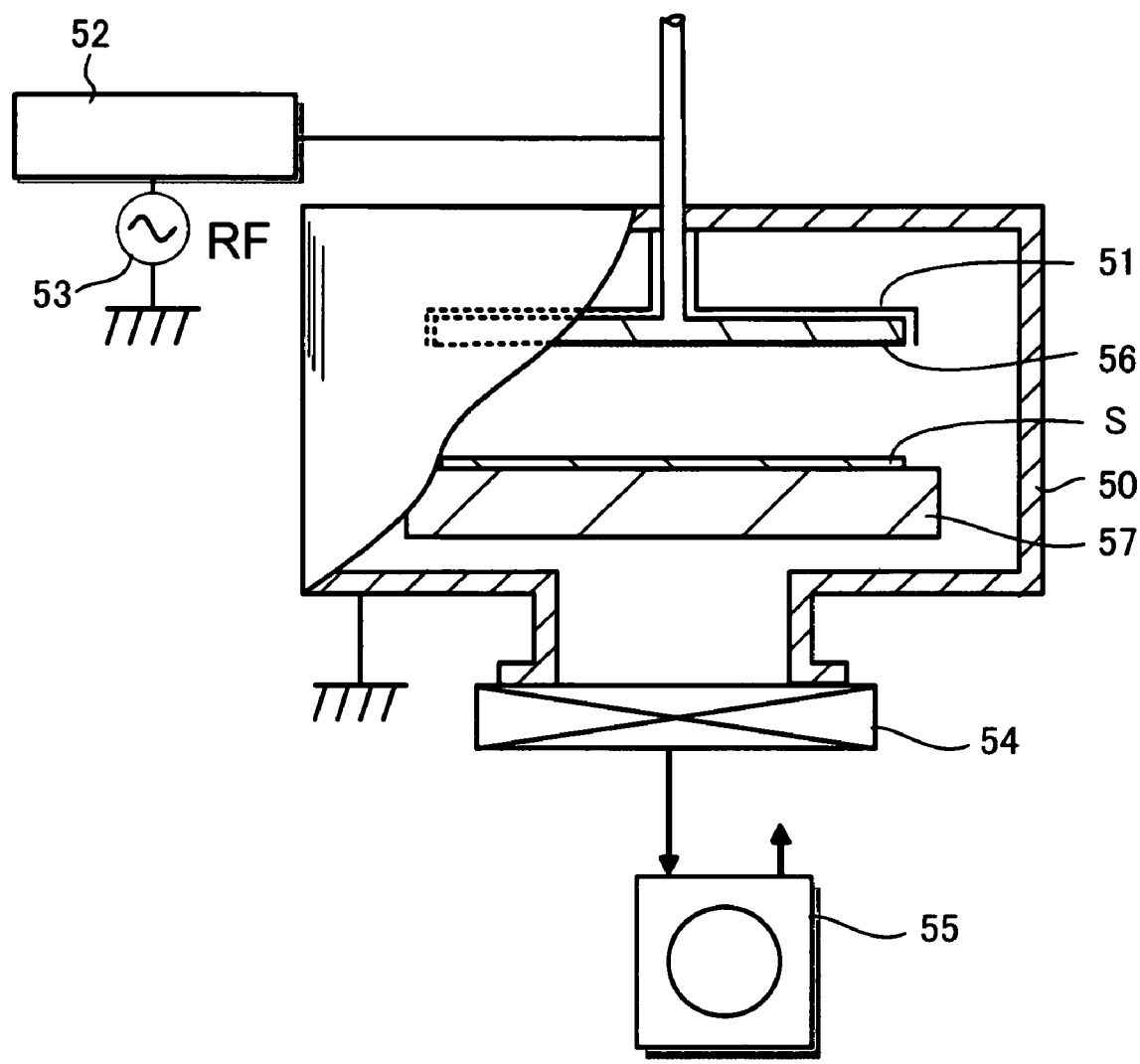
FIG. 5 is a partly sectional view showing an example of a capacitively-coupled plasma CVD apparatus.

FIG. 5 is a partly sectional view showing an example of a plasma CVD apparatus adopting a system for generating plasma called capacitively-coupled plasma (CCP).

An upper electrode 51 is installed on the upper portion of (or around) a cylindrical chamber 50, and connected to a high-frequency power source 53 through a matching circuit 52 to generate plasma. The inside of the chamber is consistently evacuated using a vacuum pump 55 connected through the valve 54, and maintained at a predetermined pressure.

A gas supply port 56 of a shower-nozzle type is also installed inside the chamber, from which the material gas is introduced.

A substrate for depositing a fluorocarbon film is placed on the substrate holding table (susceptor) 57 having an incorporated heater (not shown).

Although there are various types of inductively-coupled plasma CVD apparatuses of different locations or shapes of the coil, any of these can be used; and furthermore, various film-forming methods including capacitively-coupled (parallel-plate type) plasma CVD apparatuses and other plasma CVD apparatuses can also be used. Alternatively, an amorphous fluorocarbon film formed by a laser-abrasion method can also be used, although it is completely different film-forming method.

First Embodiment

—Film Formation Step—

As the material gas, a gas wherein a gas having relatively high volatility of the deposit (for example, $C_5F_8$, $C_4F_6$, $C_2F_4$ and the like) and a gas having relatively low volatility of the deposit (for example, $C_6F_6$, $C_{10}F_8$, $C_{12}F_{10}$ and the like) are mixed at a certain percentage must be introduced into the reaction chamber. By thus using at least two kinds of gases having difference in volatilities, that is, different vapor pressures, voids can be formed after film formation.

For example, octafluorocyclopentene [chemical formula: $C_5F_8$ (more accurately, c-$C_5F_8$)] gas has a structure having only one carbon-carbon double bond in a pentagonal cyclic structure, and is easily decomposed and highly volatile. On the other hand, since hexafluorobenzene [chemical formula: $C_6F_8$ gas] has a hexagonal resonance structure, it is stable, and has low volatility. However, high and low volatilities are relative values, and even hexafluorobenzene, which has a lower volatility than octafluorosyclopentene, is considered to vaporize at a certain rate. In addition, since both octafluorosyclopentene and hexafluorobenzene have low global warming potentials (GWP), they have little effect on the global environment. Therefore, they are advantageous even when large quantities are industrially used.

Since octafluorosyclopentene is gaseous at normal temperature and normal pressure, the installation of a heating means on the gas cylinder 33 and the piping thereof is not required; however, since hexafluorobenzene is liquid at normal temperature and normal pressure, the gas cylinder and the piping are heated to 90° C. to 110° C. using a heating device, such as a tape heater, to introduce the gas into the chamber 40 (or 50).

Before introducing the above-described gases, the chamber is evacuated, and the pressure is adjusted to, for example, 6.67 Pa (50 mTorr). High-frequency of, for example, 13.56 MHz are impressed to the high-frequency power source, and the RF output is adjusted to, for example, about 10 W to 100 W.

Next, the mixed gas of octafluorosyclopentene and hexafluorobenzene is introduced into the chamber, and the deposition of a fluorocarbon film on the substrate is started.

The temperature of the substrate in film formation is made room temperature, and can be heated as required. Although it is considered that if the substrate is heated from the time of depositing the fluorocarbon film, the deposition of the fluorocarbon film and the formation of voids occur almost simultaneously, in any case, two steps of deposition (film-forming step) and void formation (step for making porous) are carried out.

In general, in the case of a plasma CVD apparatus, if the electric power for generating plasma is increased to elevate the plasma density (for example, $1 \times 10^{11}$ cm$^{-3}$ or higher), higher gases, such as octafluorosyclopentene and hexafluorobenzene, are dissociated into lower molecules, such as $C_2$, $CF_2$, and C—CF, and the probability of adhesion to the substrate is elevated.

As described above, if various conditions, such as plasma density, the pressure in the reaction chamber, and gas flow rate, are optimized taking account of the degree of dissociation, the deposition rate and the ratio of volatile components, in other word, the content of voids and further more, the specific inductive capacity can be controlled.

Although a film having a cloudy surface was formed when the pressure in the chamber in the deposition of the fluorocarbon film was higher 6.93 Pa, when the film was formed under a pressure of 6.93 Pa or lower, a highly transparent film could be easily obtained. Since a highly transparent film is preferable for manufacturing devices, the pressure in the chamber when the fluorocarbon film is deposited is preferably 6.93 Pa or lower.

However, if the pressure in the chamber in the deposition of the fluorocarbon film is excessively low, the film-forming rate is lowered and becomes impractical. Therefore, if the introducing quantity (flow rate) of the material gas (here, octafluorosyclopentene and hexafluorobenzene) is increased and the plasma retention time is shortened, the pressure in film formation can be lowered to some extent while maintaining the film-forming rate, and as a result, a fluorocarbon film having high film quality can be obtained.

For example, as a condition when the film is deposited using a plasma-enhancing chamber, the plasma density is preferably within the range between $10^{10}$ and $10^{15}$ cm$^{-3}$. The temperature when the film is deposited is preferably within the range between 0° C. and 450° C., and more preferably between room temperature and 300° C. The pressure in the plasma-enhancing chamber is preferably within the range between 0.0133 Pa and 13.3 kPa.

—Void Formation Step—

Figure 6:
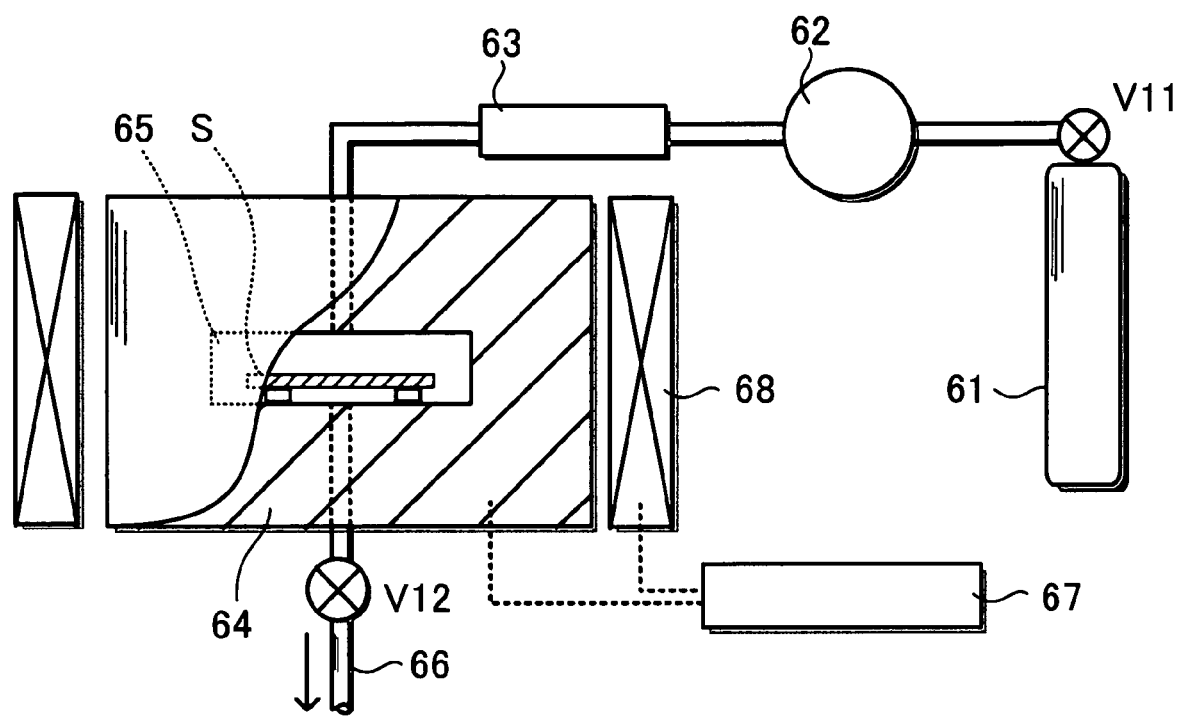
FIG. 6 is a diagram (partly sectional view) of supercritical-fluid cleaning apparatus for conducting the void forming step after the formation of a fluorocarbon film.

FIG. 6 is a block diagram of supercritical-fluid cleaning apparatus for conducting the void forming step after the formation of a fluorocarbon film.

The cylinder 61 of a supercritical fluid is connected to a high-pressure pump 62 through a valve 11, passed through a heater 63, and introduced into a high-pressure cell 64. The high-pressure cell is a metal vessel having an extremely thick wall, and a space 65 for placing a substrate S is provided inside. After filling the space 65, the supercritical fluid is passed through a pressure control valve V12, and discharged outwardly from the exhaust pipe 66. The temperatures of the heater 68 installed around the high-pressure cell 64 and the chamber is controlled by the temperature controlling device 67.

Since carbon dioxide ($CO_2$) is inexpensive and easily available, and becomes a supercritical fluid at relatively low temperature, it is preferable for carrying out the present invention. The supercritical fluid of alcohols (for example, ethanol, methanol, isopropyl alcohol and the like) or water ($H_2O$) can also be used.

When voids are formed using a supercritical fluid, the volatile components can be removed with substantially no decrease of the film thickness because no heat treatment step is carried out. Although the specific inductive capacity of the fluorocarbon film obtained using this method is often about 1.6, the specific inductive capacity becomes smaller as the content of voids is larger, and theoretically, about 1.2 can be achieved. The method shown in this embodiment is especially suitable for the interlayer insulation film of a semiconductor device and the like.

Second Embodiment

—Film Formation Step—

Using a PE-CVD reactor (high-frequency power source: 13.56 MHz) of a inductive coupling system equipped with a reaction chamber of an inner diameter of 250 mm and a height of 450 mm, a fluorocarbon film was deposited on a silicon substrate placed in the chamber under the conditions shown in Table 1.

As the CVD material gas when the fluorocarbon film was deposited, octafluorosyclopentene, hexafluorobenzene, and the mixture thereof were used.

—Void Formation Step—

Next, the fluorocarbon film deposited on the substrate was subjected to a heat treatment in a nitrogen atmosphere at 400° C. for 1 hour to selectively remove volatile components, to form voids in the fluorocarbon film.

Figure 7:
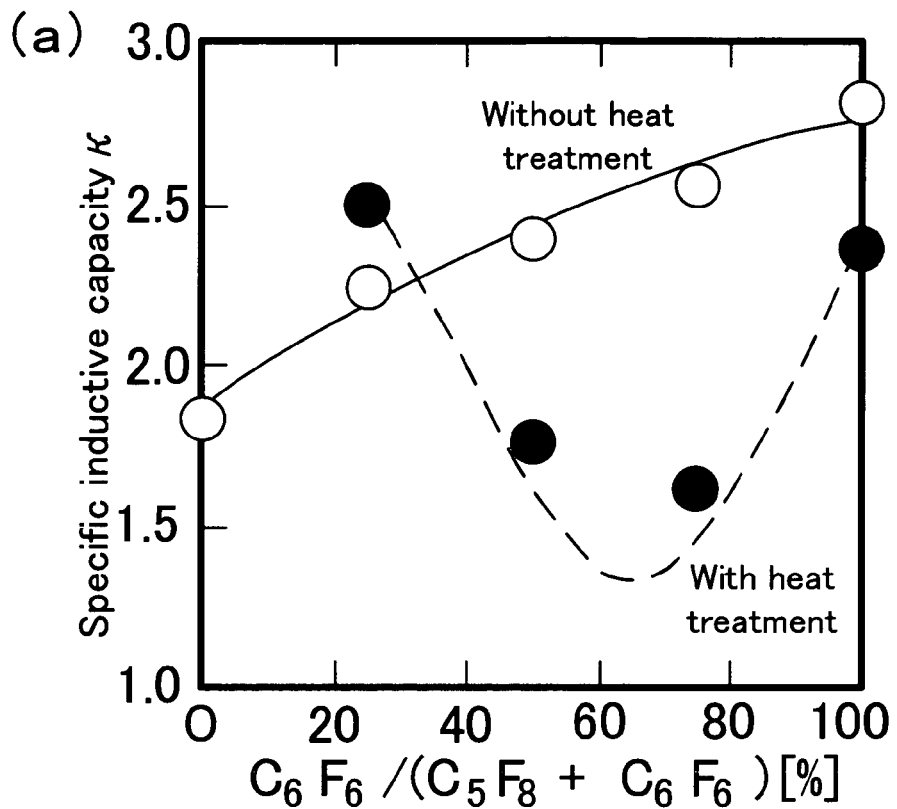
FIG. 7(a) is a block diagram showing the relationship between the specific inductive capacity κ of a fluorocarbon film heated in a nitrogen atmosphere under 1 atmosphere at 400° C. for 1 hour, and the mixing ratio of carbon fluoride gas on film forming (octafluorocyclopentene and hexafluorobenzene); and (b) is a diagram showing the relationship between the content of voids rate and the composition of the CVD material gas.
Figure 7:
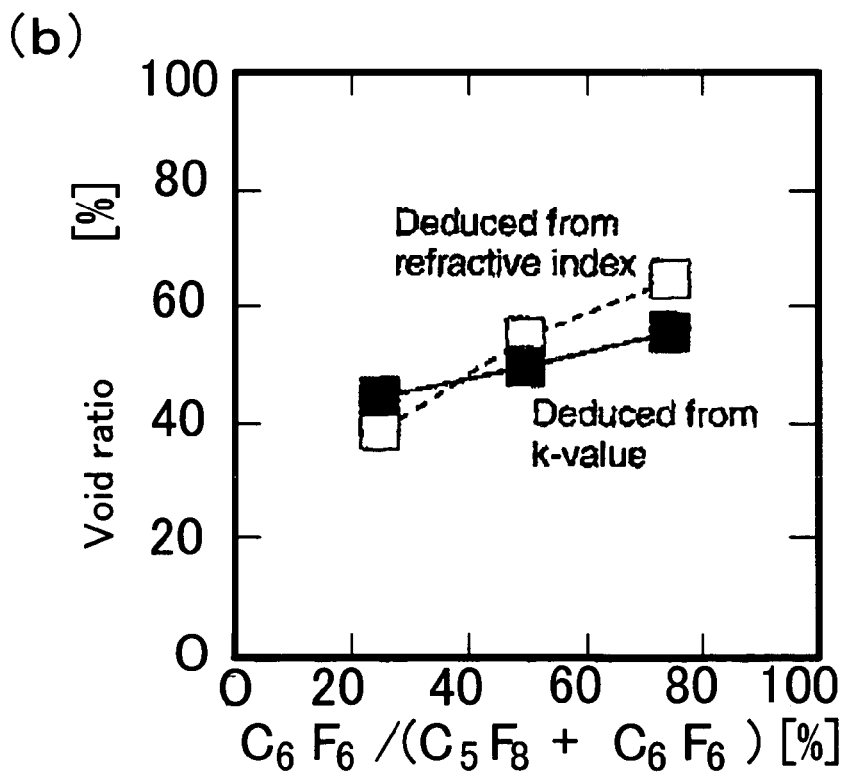

The relationship between the specific inductive capacity κ and the composition of the CVD material gas for the obtained fluorocarbon film is shown in FIG. 7(a); and the relationship between the void ratio and the composition of the CVD material gas is shown in FIG. 7 (b). The specific inductive capacity κ and the void ratio of the fluorocarbon film were obtained using a commonly used method (for example, the method described in Jpn. J. Appl. Phys., Vol. 43, No. 5A (2004), pp. 2697-2698).

TABLE 1

| | |
|---|---|
| RF output | 150 W |
| Total flow rate of gas introduced into chamber | 7.5 ml/min |
| Pressure in chamber | 6.93 Pa |
| Substrate temperature | Room temperature |

It is understood that when the mixing ratio of hexafluorobenzene is about 50% to 80%, the specific inductive capacity is markedly low. Thereby, it is considered that when the mixing ratio is low, the volatile gas (octafluorosyclopentene) volatizes, and simultaneously, the densification of the film occurs, causing the specific inductive capacity to increase. Although the deposition of octafluorosyclopentene alone is shown when the mixing ratio of hexafluorobenzene is zero, in this case, since all the volatile components were vaporized due to heat treatment, the specific inductive capacity could not be measured.

On the contrary, it is considered that if the mixing ratio was larger than 80%, since the proportion of the volatile gas (octafluorosyclopentene) decreased and the number of voids decreased, the specific inductive capacity increased.

Although decrease in the film thickness was observed when heated in a nitrogen atmosphere under 1 atmosphere at 400° C. for 1 hour, a fluorocarbon film having a specific inductive capacity of 1.5 was obtained.

Since decrease in the film thickness can be suppressed in some cases if the conditions of heat-treatment is optimized, voids can be formed by heat treatment in such cases. Film formation and void formation can be simultaneously performed by heating the substrate at given temperature from the time of film formation.

As described below, there are cases wherein some decrease in film thickness raises no problems depending on applications, and even in such cases, the void-forming step using heat treatment can be adopted.

As described above, it is understood that the fluorocarbon film wherein voids are formed using the mixed gas containing of octafluorocyclopenten and hexafluorobenzene as the CVD material has a moderate void ratio by heat treatment thereafter performed, and especially excels in the insulation performance.

Third Embodiment

—Application of Printed Substrate for High-frequency Circuits to Surface-coating Material—

By forming a fluorocarbon film according to the present invention on the surface of the printed substrate for high-frequency circuits using the method described in first or second embodiment or the like, parasitic capacity can be reduced, and high-frequency characteristics can be improved.

Figure 8:
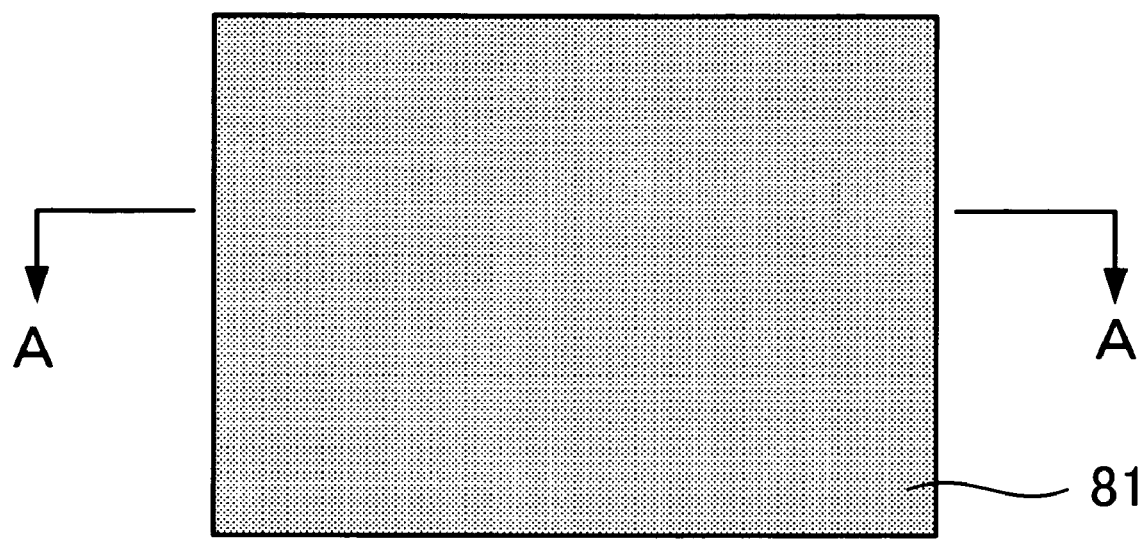
FIG. 8(a) is a front view of a printed substrate for high-frequency on which a fluorocarbon film according to the present invention is deposited; and (b) is an A-A sectional view in FIG. 8(a)
Figure 8:
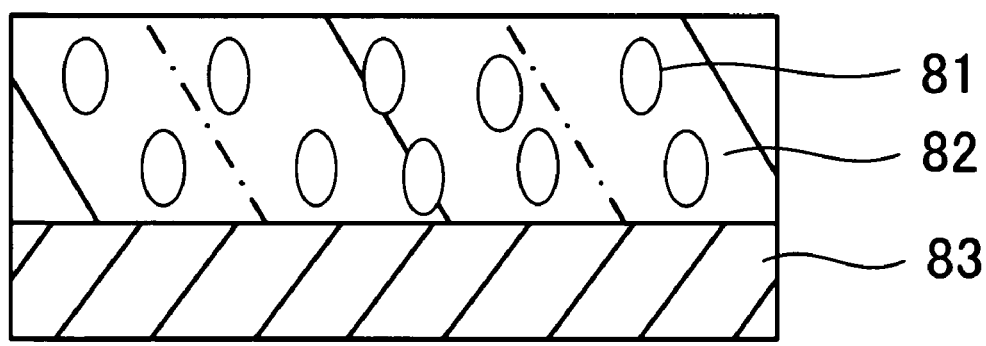

FIG. 8(a) is a front view of a printed substrate for high-frequency on which a fluorocarbon film according to the present invention is deposited; and (b) is an A-A sectional view in Figure (a). As these drawings show, there are formed a fluorocarbon film 82 wherein a large number of voids 81 are formed so as to coat the surface of a printed substrate for high-frequency 83.

As described above, since the fluorocarbon film according to the present invention has a specific inductive capacity of 2 or below, which is extremely lower than the specific inductive capacity of conventional low-dielectric-constant film, if the film thickness is several microns to several tens of microns to coat the surface of the printed substrate for high-frequency 83, the dielectric loss is dramatically lowered, and the delay of signal transmission, the interference of signals, the attenuation of signals, the heat generation of circuits and power consumption can be reduced.

Fourth Embodiment

—Application to Gas-adsorbing Material—

Although the fluorocarbon film according to the present invention was initially assumed to utilize as the interlayer insulation films of semiconductor integrated circuits, it is also considered to be useful as a gas adsorbing material if the porous structure of the obtained low-dielectric-constant film is positively utilized. Therefore, these will be described in the following embodiments.

Figure 9:
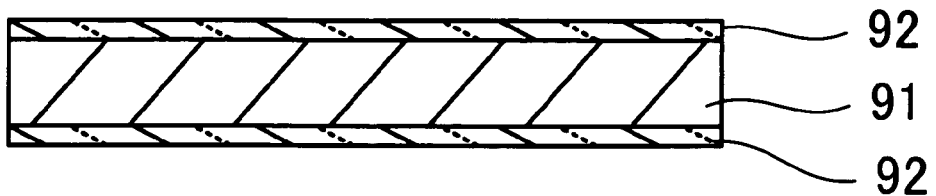
FIG. 9(a) is a sectional view of a substrate having a fluorocarbon film formed on the surface thereof; (b) is a perspective view of a string having a fluorocarbon film according to the present invention formed on the surface thereof.
FIG. 9(c) is a sectional view of film forming apparatus showing the aspect of depositing a fluorocarbon film according to the present invention on the surface of the string.
Figure 9:
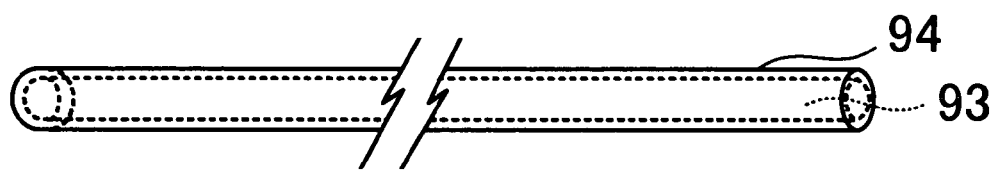
Figure 9:
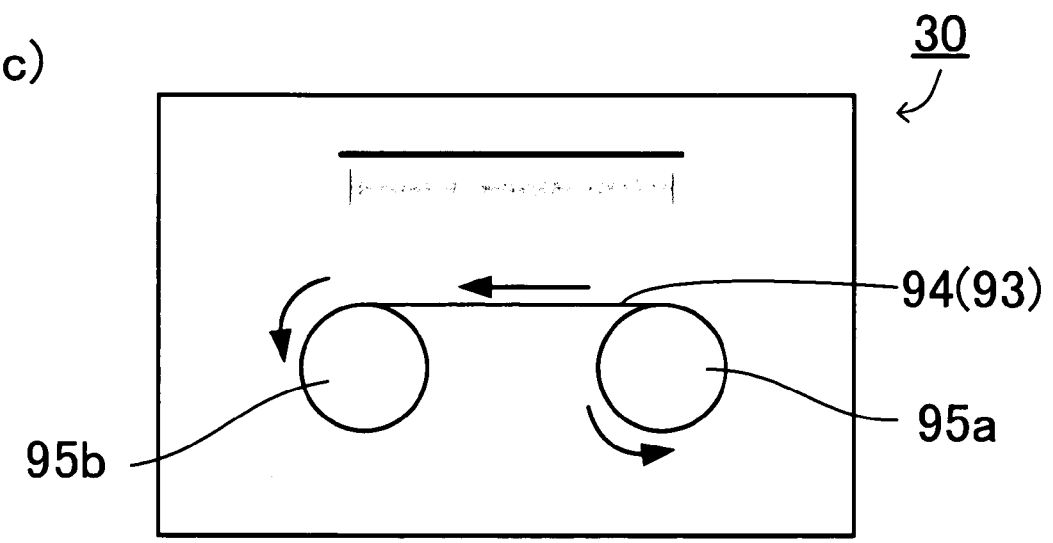

FIG. 9(a) shows a sectional view wherein a fluorocarbon film 92 of several microns to several tens of microns is formed on the both surfaces of the substrate 91. The substrate 91 can be any substrate if it becomes a base material for forming a fluorocarbon film, and since it can be formed at room temperature, any kind of substrate, such as a plastic substrate, can be used.

FIG. 9(b) shows an embodiment wherein a fluorocarbon film 94 according to the present invention is formed on the surface of a string 93. In order to coat the surface of the string 93, for example, as FIG. 9(c) shows, reels 95a and 95b are installed in the film forming apparatus 30 and rotated, and after the film has been formed while winding the string 93 from a reel to the other, the wound reel is installed in the supercritical-fluid apparatus as it is. Since the supercritical fluid has extremely high permeability, the void forming treatment can be sufficiently performed even in the wound state.

INDUSTRIAL APPLICABILITY

Since the specific inductive capacity of the fluorocarbon film according to the present invention is 2 or less, when it is applied to the interlayer insulation film of a highly integrated semiconductor device, such as an ultra LSI, signal delay time can be significantly reduced, and is expected as the basic technology of next-generation semiconductor devices.

Also as another example of application, there are uses other than the interlayer insulation film, such as application to a gas adsorbing material, a surface-coating material of a printed substrate for a high-frequency circuit, and the like by utilizing porous or low-dielectric-constant characteristics.

As described above, the industrial applicability of the present invention is extremely large.

The invention claimed is:

1. A method for manufacturing a fluorocarbon film wherein a specific inductive capacity is within a range of 2 or less comprising introducing a mixed gas comprising a first carbon fluoride gas and a second carbon fluoride gas on a substrate placed inside a chamber, depositing a fluorocarbon film on said substrate; forming a large number of fine voids in said fluorocarbon film by selectively removing volatile components contained in said fluorocarbon film.

2. A method for manufacturing a fluorocarbon film wherein a specific inductive capacity is within a range of 2 or less comprising introducing a mixed gas comprising a first carbon fluoride gas and a second carbon fluoride gas on a substrate placed inside a chamber, depositing a fluorocarbon film on said substrate; forming a large number of fine voids in said fluorocarbon film by selectively removing volatile components contained in said fluorocarbon film; wherein
said first carbon fluoride-containing compound having 4 to 5 carbon atoms; and said second carbon fluoride gas is a fluorine-containing compound having 6 to 12 carbon atoms.

3. The method for manufacturing a fluorocarbon film according to claim 2, wherein said first carbon fluoride gas is octafluorocyclopentene.

4. The method of manufacturing a fluorocarbon film according to claim 2, wherein said second carbon fluoride gas is hexafluorobenzene.

5. The method of manufacturing a fluorocarbon film according to claim 1 wherein said step for forming voids includes a step for cleaning said fluorocarbon film with a supercritical fluid.

6. The method of manufacturing a fluorocarbon film according to claim 1 wherein said step for forming voids includes a step for heating said fluorocarbon film.

7. The method of manufacturing a fluorocarbon film according to claim 1 wherein said chamber is a plasma exciting chamber that can internally generate plasma.

8. The method of manufacturing a fluorocarbon film according to claim 1 wherein said first carbon fluoride gas has relatively high volatility and said second carbon fluoride gas has relatively low volatility.

9. A fluorocarbon film wherein a large number of fine voids are internally formed and specific inductive capacity is within a range of 2 or less.

10. A surface-coating material for a printed substrate for high-frequency circuits composed of the fluorocarbon film according to claim 9.

11. A gas adsorbing material that contains the fluorocarbon fluid according to claim 9.

12. An electronic device that uses the fluorocarbon film according to claim 9 in at least a part.

13. A method for manufacturing a fluorocarbon film which is used as interlayer insulation films for semiconductor devices comprising introducing a mixed gas comprising a first carbon fluoride gas and a second carbon fluoride gas on a substrate placed inside a chamber, and depositing a fluorocarbon film on said substrate; forming a large number of fine voids in said fluorocarbon film by selectively removing volatile components contained in said fluorocarbon film.

14. A method for manufacturing a fluorocarbon film which is used as interlayer insulation films for semiconductor devices characterized by including a step for introducing a mixed gas comprising a first carbon fluoride gas and a second carbon fluoride gas on a substrate placed inside a chamber, and depositing a fluorocarbon film on said substrate; and a step for forming a large number of fine voids in said fluorocarbon film by selectively removing volatile components contained in said fluorocarbon film; wherein said first carbon fluoride gas is a fluorine-containing compound having 4 to 5 carbon atoms; and said second carbon fluoride gas is a fluorine-containing compound having 6 to 12 carbon atoms.

15. The method for manufacturing a fluorocarbon film according to claim 14, wherein said first carbon fluoride gas is octafluorocyclopentene.

16. The method for manufacturing a fluorocarbon film according to claim 14, wherein said second carbon fluoride gas is hexafluorobenzene.

17. The method for manufacturing a fluorocarbon film according to claim 13 wherein said step for forming voids includes a step for cleaning said fluorocarbon film with a supercritical fluid.

18. The method for manufacturing a fluorocarbon film according to claim 13 wherein said step for forming voids includes a step for heating said fluorocarbon film.

19. The method for manufacturing a fluorocarbon film according to claim 13 wherein said chamber is a plasma exciting chamber that can internally generate plasma.

20. The method for manufacturing a fluorocarbon film according to claim 13 wherein said first carbon fluoride gas has relatively high volatility and said second carbon fluoride gas has relatively low volatility.

* * * * *